United States Patent
Perner

(10) Patent No.: US 7,337,284 B2
(45) Date of Patent: Feb. 26, 2008

(54) INTEGRATED SEMICONDUCTOR MEMORY

(75) Inventor: Martin Perner, München (DE)

(73) Assignee: Infineon Technologies, AG, Neubiberg (DE)

(*) Notice: Subject to any disclaimer, the term of this patent is extended or adjusted under 35 U.S.C. 154(b) by 274 days.

(21) Appl. No.: 11/191,141

(22) Filed: Jul. 28, 2005

(65) Prior Publication Data

US 2006/0023523 A1 Feb. 2, 2006

(30) Foreign Application Priority Data

Jul. 28, 2004 (DE) ...................... 10 2004 036 546

(51) Int. Cl.
*G06F 12/00* (2006.01)
(52) U.S. Cl. .................................... 711/154
(58) Field of Classification Search ................ 711/105, 711/154; 714/718
See application file for complete search history.

(56) References Cited

U.S. PATENT DOCUMENTS

| 4,692,640 | A | 9/1987 | Suzuki et al. |
| 4,809,228 | A | 2/1989 | Iida |
| 6,125,157 | A | 9/2000 | Donnelly et al. |
| 6,197,620 | B1 * | 3/2001 | Merritt ........................ 438/129 |
| 6,754,110 | B2 * | 6/2004 | Beer et al. ............. 365/189.07 |
| 7,162,671 | B2 * | 1/2007 | Hasegawa et al. ........... 714/718 |
| 7,187,603 | B2 * | 3/2007 | Nagata et al. ............... 365/200 |
| 7,203,106 | B2 * | 4/2007 | Versen et al. ............... 365/200 |
| 7,206,980 | B2 * | 4/2007 | Auge et al. .................. 714/718 |
| 2002/0184275 | A1 | 12/2002 | Dutta |
| 2004/0114409 | A1 | 6/2004 | Breton et al. |

* cited by examiner

*Primary Examiner*—Hiep T. Nguyen
(74) *Attorney, Agent, or Firm*—Edell, Shapiro & Finnan, LLC

(57) ABSTRACT

An integrated semiconductor memory includes a memory cell array having memory cells for storing a datum having a first and a second data value. An input datum present at a data terminal is stored multiply in the memory cells of the memory cell array. In order to read out the input datum, the multiply stored input data are fed to an evaluation circuit. The evaluation circuit generates, on the output side, an output datum having the data value that was stored more frequently in the memory cells used for multiple storage of the input datum than other data values. The integrated semiconductor memory thus makes it possible to reduce transfer errors when reading data into the memory cell array or reading data out of the memory cell array.

29 Claims, 5 Drawing Sheets

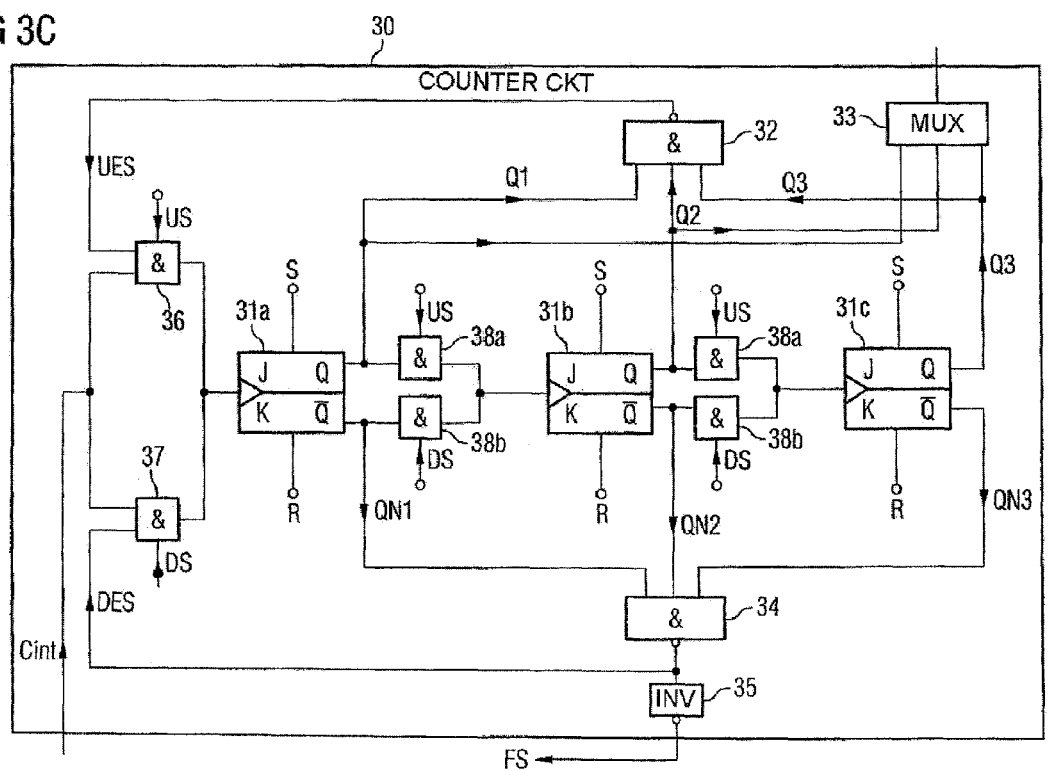

INTEGRATED SEMICONDUCTOR MEMORY

CROSS-REFERENCE TO RELATED APPLICATIONS

This application claims priority under 35 U.S.C. §119 to German Application No. DE 10 2004 036546.6, filed on Jul. 28, 2004, and titled "Integrated Semicondcutor Memory," the entire contents of which are hereby incorporated by reference.

FIELD OF THE INVENTION

The invention relates to an integrated semiconductor memory.

BACKGROUND

Integrated semiconductor memories, for example, DRAM (dynamic random access memory) semiconductor memories, generally include a plurality of memory cell arrays, in which memory cells are arranged at the crossover points of word and bit lines. An individual DRAM memory cell is constructed from a selection transistor and a storage capacitor. The selection transistor acts as a controllable switch and is driven by a signal on a word line connected to its control terminal. For a write or read access to the memory cell, the selection transistor is controlled in the on state, so that the storage capacitor is connected to the connected bit line.

The task of semiconductor memories is to reliably store and read out an item of information. A memory cell of the memory cell array is accessed by an address. Erroneous memory processes can be identified by reading and comparing a read data value with the data value to be expected. If, during production of the integrated semiconductor memory, an error is detected during storing and reading the stored data value of a memory cell, the word or bit line connected to the memory cell read in erroneous fashion is replaced, if possible, by a redundant word or bit line. Because the redundant word and bit lines are generally present only in a small number, integrated semiconductor memories can only be repaired up to a certain degree of error.

During the operation of an integrated semiconductor memory that left production as an error-free device, transfer errors can occur when writing data to the memory cell array or when reading data out of the memory cell array. In this case, a distinction is drawn between random and hard transfer errors. Random errors occur, for example, if DRAM memory cells do not retain the charge stored on their storage capacitor until the next refresh, so that the information stored is at least partly lost. Hard transfer errors arise, for example, in a column or row decoder fails. With a hard transfer error, all memory cells addressed via the defective column or row decoder can no longer be accessed without errors.

Error code correction methods (ECC) are used as error correction measures for suppressing signal disturbances during the operation of the integrated semiconductor memory. In case of an error, the stored datum and a datum stamp specifying the number of bit positions of a datum at which errors have occurred and how the errors must be corrected in connection with the information are stored.

However, using an ECC correction method has numerous disadvantages. Thus, the hardware implementation required for the ECC analysis is generally very complex. Even in error-free operation of the memory, it is necessary to provide memory space for the ECC method. Due to the long correction duration of the method, use of ECC methods in long-term operation is suitable only for the correction of randomly occurring individual errors. The method is disproportionately complex for suppressing known hard and frequent cell errors. A further disadvantage is that the complexity of the error analysis hardware and of the required memory redundancy for the ECC calculation is fixed from the outset and thus cannot be adapted to the requirements.

In practice, however, there are numerous cases in which reliably storing and reading out items of information again from the memory cell array are not matters of prime significance. In research and development, for example, there is interest in the functionality of a new circuit component on the semiconductor chip. If it is possible to drastically reduce the error rate of an input or output data record, newly developed products would be available for characterization purposes and possibly for a first application test even if they still had numerous and unrepaired errors in the memory cell array. Consequently, first technology studies could be carried out with as yet unrepaired semiconductor memories without having to account for cell array problems.

An integrated semiconductor memory in which erroneous input and output data, in particular for test and analysis purposes, are corrected on the semiconductor chip without having to carry out comprehensive cell array repairs in the context of a redundancy analysis is desirable. Further, a method for testing an integrated semiconductor memory in which erroneous input and output data are corrected on the semiconductor chip without having to carry out extensive cell array repairs in a redundancy analysis is desirable.

SUMMARY

An integrated semiconductor memory includes a data terminal for applying input data and generating output data, and a memory cell array having memory cells for storing a datum having a first or a second data value. The memory cell array is designed such an input datum of the input data can be stored multiple times in the memory cells of the memory cell array. The integrated semiconductor memory further includes an evaluation circuit having a first storage register, a second storage register, an input terminal for applying input data, and a first output terminal for generating an output datum. The input data stored multiple times in the memory cells of the memory array can be fed to the input terminal of the evaluation circuit as input data. The first and second data values of one of the input data can be stored in the first and second storage registers. The evaluation circuit is designed such that the first data value of the input data is stored in the second storage register, if the first data value occurs more frequently in the input data than the second data value, and the second data value of the input data is stored in the second storage register, if the second data value occurs more frequently in the input data than the first data value. The second storage register is connected to the first output terminal of the evaluation circuit for outputting of the output datum. Furthermore, the first output terminal of the evaluation circuit for outputting of the output datum can be connected to the data terminal.

In one implementation, the integrated semiconductor memory includes a counter circuit having a counter register for storing a first counter reading. The counter circuit is connected to the evaluation circuit on the input side. The counter circuit is designed such that the first counter reading of the counter register is increased, if a datum of the input data having the first or second data value is fed to the evaluation circuit on the input side. The counter circuit is designed such that the first counter reading of the counter register is increased, if a further datum of the input data having the same data value as the first datum of the input data is fed to the evaluation circuit on the input side. Furthermore, the counter circuit is designed such that the first counter reading of the counter register is decreased, if the further datum of the input data having a different data value than the first datum of the input data is fed to the evaluation circuit on the input side.

In one embodiment of the integrated semiconductor memory according to the invention, the evaluation circuit has a second output terminal for generating a first control signal and a third output terminal for generating a second control signal. The evaluation circuit drives the counter circuit with the first control signal, if the further datum of the input data having the same data value as the first datum of the input data is fed to the evaluation circuit on the input side. The evaluation circuit drives the counter circuit with the second control signal, if the further datum of the input data having a different data value than the first datum of the input data is fed to the evaluation circuit on the input side.

In another implementation of the integrated semiconductor memory, the evaluation circuit generates the first control signal, if the data value of the first storage register matches the data value of the second storage register. The evaluation circuit also generates the second control signal, if the data value of the first storage register differs from the data value of the second storage register.

In another implementation of the integrated semiconductor memory, the evaluation circuit includes a terminal for applying a reset signal. The evaluation circuit is designed such that the data values stored in the first and second storage registers are erased when the reset signal is applied.

In a further implementation of the integrated semiconductor memory according to the invention, the counter circuit has a first input terminal for applying the first control signal and a second input terminal for applying the second control signal. The counter circuit increases the first counter reading of the counter register, if its first input terminal is driven with the first control signal of the evaluation circuit, and decreases the first counter reading of the counter register, if its second input terminal is driven with the second control signal of the evaluation circuit.

In one implementation of the integrated semiconductor memory, a first threshold value and a second threshold value can be stored in the first counter register of the counter circuit. In this case, the counter circuit leaves the first counter reading of the counter register unchanged, if the first counter reading of the counter register has the first and the second threshold value.

In another implementation of the integrated semiconductor memory, the counter register includes a plurality of multivibrators. In this case, the multivibrators are connected to one another such that the first counter reading of the counter register is increased when the counter register is driven with the first control signal and decreased when the counter register is driven with the second control signal.

In accordance with a further feature of the integrated semiconductor memory according to the invention, the counter circuit has a terminal for applying the reset signal. The counter circuit is designed such that the first counter reading stored in the counter register is erased when the reset signal is applied.

In another implementation, the integrated semiconductor memory includes an event counter having a counter register for storing a second counter reading. The event counter is designed such that the second counter reading of the event counter is increased, if an input datum of the input data is fed to the evaluation circuit.

In another embodiment, the event counter has a terminal for applying the reset signal. In this case, the event counter is designed such that the second counter reading stored in the counter register of the event counter is erased when the reset signal is applied.

In another implementation, the integrated semiconductor memory according to the invention includes a receiver circuit having a first control terminal for applying a first control signal, a second control terminal for applying a second control signal, and a third control terminal for applying a third control signal. In this case, the receiver circuit is designed such that, in the case of driving with the first control signal, the data terminal for inputting and outputting data is connected to the memory cell array. The receiver circuit is also designed such that, in the case of driving with the second control signal, the data of the memory cell array are fed to the input terminal of the evaluation circuit. Further, the receiver circuit is designed such that, in the case of driving with the third control signal, the input data present at the data terminal are fed to the input terminal of the evaluation circuit as input data.

In accordance with one implementation of the integrated semiconductor memory, the evaluation circuit has a control terminal for applying a fourth control signal. The evaluation circuit generates the output datum at its first output terminal, in the case of driving with the fourth control signal.

According to a further feature of the invention, the integrated semiconductor memory can be operated in a first operating mode. The integrated semiconductor memory has a control circuit with a control terminal for applying control signals. The control circuit operates the integrated semiconductor memory in the first operating mode when a first control signal is applied to the control terminal of the control circuit. When the integrated semiconductor memory is operated in the first operating mode, for driving the receiver circuit, the control circuit generates the first control signal and drives the memory cell array such that a respective datum of the input data present at the data terminal is stored in one of the memory cells of the memory cell array.

In another implementation of the integrated semiconductor memory, the integated semiconductor memory can be operated in a second operating mode for a multiple storage of input data present at the data terminal. In this case, the control circuit operates the integrated semiconductor memory in the second operating mode when a second control signal is applied to the control terminal of the control circuit. Furthermore, when the integrated semiconductor memory is operated in the second operating mode, the control circuit drives the receiver circuit with the first control signal and drives the memory cell array such that a respective input datum of the input data is stored in at least two of the memory cells of the memory cell array.

In a further embodiment of the integrated semiconductor memory according to the invention, in the second operating mode of the integrated semiconductor memory, the control circuit subdivides the memory cell array into a first memory area and at least one second memory area. The at least one of the two memory cells is arranged in the first memory area and the other of the at least two memory cells is arranged in the second memory area.

In one implementation, the integrated semiconductor memory can operate in a third operating mode. In this case, the control circuit operates the integrated semiconductor memory in the third operating mode, when a third control signal is applied to the control terminal of the control circuit. When the integrated semiconductor memory is operated in the third operating mode, the control circuit drives the receiver circuit with the second control signal.

In accordance with a further feature of the invention, the integrated semiconductor memory can operate in a fourth operating mode. In this case, the control circuit operates the integrated semiconductor memory in the fourth operating mode, when a fourth control signal is applied to the control terminal of the control circuit. When the integrated semiconductor memory is operated in the fourth operating mode, the control circuit drives the receiver circuit with the third control signal.

In another form of configuration of the integrated semiconductor memory according to the invention, the control circuit has a storage component. The storage component of the control circuit stores items of information for the operation of the integrated semiconductor memory in the second, third, and fourth operating modes.

In a further embodiment of the integrated semiconductor memory according to the invention, the storage component of the control circuit stores the items of information about the number of multiple storage of the respective input datum of the input data in the memory cells of the memory cell array when the integrated semiconductor memory is operated in the second operating mode. Furthermore, the storage component of the control circuit stores the items of information about the number of input data. After feeding the items of information to the evaluation circuit, the control circuit generates the fourth control signal when the integrated semiconductor memory is operated in the third and fourth operating modes.

According to a further feature of the invention, the integrated semiconductor memory according to the invention is in a circuit arrangement that has a hard disk storage device. The control circuit of the integrated semiconductor memory stores the data value that was stored in the other of the two memory cells in the hard disk storage device, prior to the multiple storage of the respective input datum of the input data in the other of the two memory cells arranged in the second memory area of the memory cell array.

A method for testing includes an integrated semiconductor memory with an evaluation circuit having a first storage register and a second storage register for storing a first and second data value, an input terminal for applying input data, and an output terminal for generating an output datum to be provided for the method. Input data are applied with their data values to a data terminal of the integrated semiconductor memory. This is followed by multiple storage of a respective input datum of the input data by storing the respective input datum of the input data in at least two memory cells of a memory cell array. Afterward, the input data stored in the at least two memory cells for multiple storage are fed as input data of the evaluation circuit to the input terminal of the evaluation circuit. A data value of a first datum of the input data is stored in the first storage register and the second storage register. A data value of each datum of the input data that succeeds the first datum is subsequently buffer-stored in the first storage register. The first data value is stored in the second storage register, if the first data value has been buffer-stored more frequently in the first storage register than the second data value. The second data value is stored in the second storage register, if the second data value has been buffer-stored more frequently in the first storage register than the first data value. The data value stored in the second storage register is subsequently fed to the data terminal.

In another method for testing an integrated semiconductor memory, an integrated semiconductor memory has an evaluation circuit with a first storage register and a second storage register for storing a first and second data value, an input terminal for applying input data, and an output terminal for generating an output datum. Input data are applied with their data values to a data terminal of the integrated semiconductor memory. The input data applied to the data terminal are fed as input data to the input terminal of the evaluation circuit. A data value of a first datum of the input data is stored in the first storage register and the second storage register. A data value of each datum of the input data that succeeds the first datum is subsequently buffer-stored in the first storage register. The first data value is stored in the second storage register, if the first data value has been buffer-stored more frequently in the first storage register than the second data value. The second data value is stored in the second storage register, if the second data value has been buffer-stored more frequently in the first storage register than the first data value. The data value stored in the second storage register is fed to one of the memory cells of the memory cell array for storage.

In accordance with one implementation of the method for testing an integrated semiconductor memory, a first counter reading is increased, if the data value buffer-stored in the first storage register matches the data value stored in the second storage register. On the other hand, the first counter reading is decreased, if the data value buffer-stored in the first storage register is different from the data value stored in the second storage register. A second counter reading is increased each time a respective datum of the input data is fed to the evaluation circuit.

In an exemplary preferred embodiment of the method for testing an integrated semiconductor memory, the first and second counter readings can be fed to the data terminal.

A method for testing a circuit arrangement having an integrated semiconductor memory provides a circuit arrangement having an integrated semiconductor memory having a memory cell array having at least two memory cells which can be used for a multiple storage of a data value of a datum, and a hard disk storage device. Input data are applied with their data values to a data terminal of the integrated semiconductor memory. The memory cell array is subdivided into a first memory area and into a second memory area. A first of the at least two memory cells, which is used for a multiple storage, is arranged in the first memory area of the memory cell array and a second of the at least two memory cells, which is used for a multiple storage, is arranged in the second memory area. Before the beginning of the multiple storage, the data value stored in the second memory cell of the at least two memory cells is stored in the hard disk storage device and thus paged out there. This is followed by the multiple storage of a respective input datum of the input data by storing the respective input datum of the input data in the first memory cell in the first memory area and in the second memory cell in the second memory area of the memory cell array.

BRIEF DESCRIPTION OF THE DRAWINGS

The invention is explained in more detail below with reference to figures showing exemplary embodiments of the invention, in which:

FIG. 3C shows a third embodiment of a counter register in accordance with the invention.

DETAILED DESCRIPTION

Figure 1:
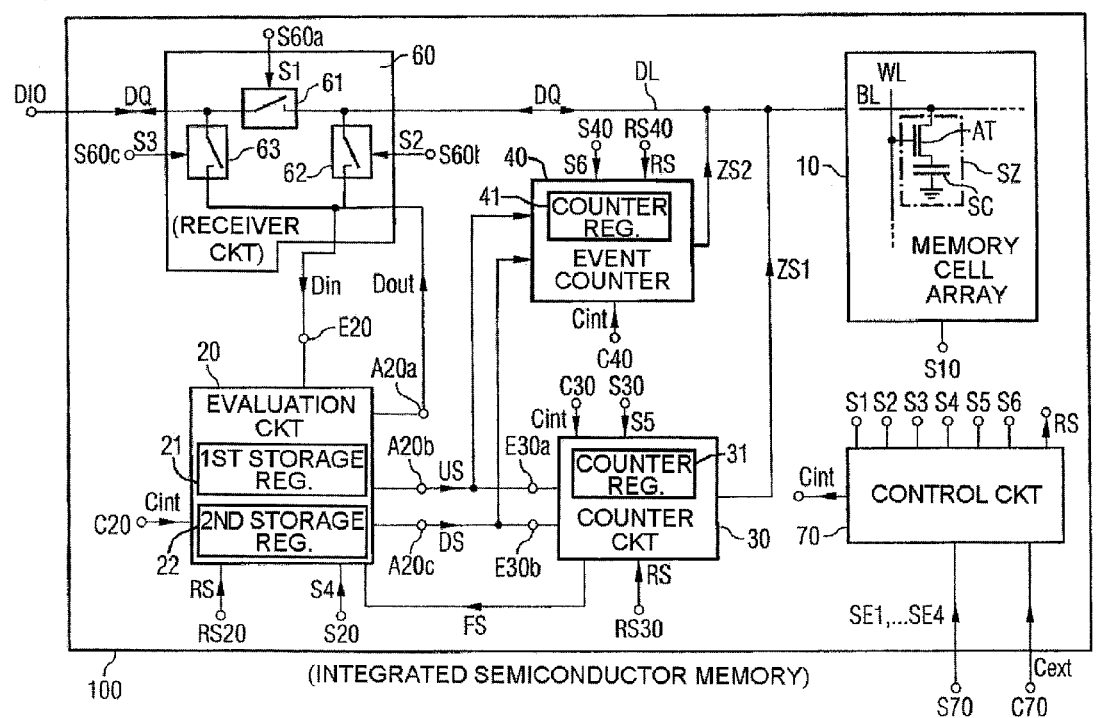
FIG. 1 shows an embodiment of an integrated semiconductor memory for reducing transfer errors in accordance with the invention.

FIG. 1 shows an integrated semiconductor memory having a memory cell array 10. The memory cells SZ are arranged at crossover points of a word line WL and a bit line BL. A DRAM memory cell SZ with a selection transistor AT and a storage capacitor SC are illustrated in the memory cell array 10. Memory operations within the memory cell array can be controlled by the applying control signals to a control terminal S10 of the memory cell array. The memory cell array 10 is connected to a receiver circuit 60 via a data line DL for writing in data DQ or for reading out data DQ.

The receiver circuit 60 has a first controllable switch 61 controlled by of a control signal S1 applied to a first control terminal S60a, a second controllable switch 62 controlled by of a second control signal S2 at a second control input S60b, and a third controllable switch 63 controlled by a third control signal S3 at a third control terminal S60c. Via the first controllable switch 61, a data terminal DIO for applying input data DQ or for the read-out of output data DQ can be connected to the data line DL and thus to the memory cell array 10.

The integrated semiconductor memory 100 according to the invention furthermore has an evaluation circuit 20 including a first storage register 21 and a second storage register 22. The evaluation circuit 20 is connected to the receiver circuit 60 via an input terminal E20 for applying input data Din. In order to evaluate data from the memory cell array, the evaluation circuit 20 can be connected to the data line DL via the second controllable switch 62. A first output terminal A20a of the evaluation circuit 20 for generating an output datum Dout is connected to the receiver circuit 60. Via the second controllable switch 62 of the receiver circuit 60, the output datum Dout can be written to the memory cell array 10. Via the third controllable switch 63 of the receiver circuit 60, the output datum Dout is forwarded for outputting to the data terminal DIO. A data value of the input datum Din can be stored in the first storage register 21 and the second storage register 22. In the case of driving with an internal clock signal Cint at a clock terminal C20, the evaluation circuit 20 reads the data value of a first input datum of the input data Din into the first storage register 21 and into the second storage register 22. In the case of a subsequent internal clock signal Cint, a further data value of a further input datum Din is read into the first storage register 21 and compared with the data value stored in the second storage register 22. If both data values match, the evaluation circuit 20 generates a first control signal US at a second output terminal A20b and feeds the first control signal US to a first input terminal E30a of a counter circuit 30. By contrast, if the data value of the further input datum differs from the data value of the first input datum, the evaluation circuit 20 generates a second control signal DS at a third output terminal A20c and feeds the second control signal DS to a second input terminal E30b of the counter circuit 30.

The counter circuit 30 has a counter register 31 for storing a first counter reading ZS1. When the counter circuit 30 is driven with the first control signal US, the counter reading of the counter register 31 is increased. The counter reading of the counter register 31 decreases when the counter circuit is driven with the second control signal DS. In this case, driving of the input terminals E30a, E30b with the first and second control signals is interrogated by the counter circuit 30 upon each internal control clock Cint.

The counter register 31 may also prevent an overflow, when a first high threshold value is reached, and an underflow, when a second low threshold value is reached. If the first counter reading ZS1 of the counter register 30 has reached the low threshold value, for example, the value 0, the counter circuit 30 generates an enable signal FS and feeds the enable signal FS to the evaluation circuit 20. In this case in which the counter register 31 has been counted down as far as the low threshold value, the data value stored in the first storage register 21 has occurred just as frequently in the input data Din as the data value currently still stored in the second storage register 22. The input datum present at the input terminal E20 upon the next internal control clock signal Cint is stored in the second storage register.

After an arbitrary number of input data Din, that data value of the input data which has occurred more frequently in the input data stream of the input data Din than other data values is thus stored in the second storage register 22.

After the evaluation circuit 20 has been driven by a fourth control signal S4 at a control terminal S20, the evaluation circuit 20 generates the output datum Dout, which corresponds to the current data value stored in the storage register 22, at its first output terminal A20a. The output datum Dout thus corresponds to that data value which has occurred more frequently within the input data than other data values.

In the case where the counter circuit 30 is driven with a fifth control signal S5 applied to a control terminal S30, the counter circuit 30 forwards, on the output side, the first counter reading ZS1 via the data line DL for outputting to the data terminal DIO.

The integrated semiconductor memory 100 furthermore includes an event counter 40 having a counter register 41 for storing a second counter reading ZS2. The event counter 40 is driven by the first control signal US and the second control signal DS of the evaluation circuit on the input side. The event counter has a clock input C40 for applying the internal control clock Cint. Upon each edge of the internal control clock Cint, the second counter reading ZS2 of the counter register 41 is increased, if the first control signal US or the second control signal DS is fed to the event counter 40 on the input side.

The event counter 40 thus counts the number of input data Din fed to the evaluation circuit 20 up to the generating the output datum Dout. By a sixth control signal S6 at a control terminal S40 of the event counter, the second counter reading ZS2 of the counter register 41 can be read out and fed to the data terminal DIO via the data line DL.

For controlling memory operations within the memory cell array 10, for controlling the controllable switches 61, 62, 63 of the receiver circuit 60, for driving the evaluation circuit 20 with the fourth control signal S4, for driving the counter circuit 30 with the fifth control signal S5, and for driving the event counter 40 with the sixth control signal S6, the integrated semiconductor memory 100 has a control circuit 70. The control circuit 70 generates the control signals S1, S2, ..., S6 and a reset signal RS on the output side.

By driving the evaluation circuit 20 with the reset signal RS at a terminal RS20 for applying the reset signal, it is possible to erase the stored data values in the first storage register 21 and the second storage register 22. Likewise, by applying the reset signal RS to a terminal RS30 of the counter circuit 30 and a terminal RS40 of the event counter 40, it is possible to erase the first counter reading ZS1 of the counter register 31 and the second counter reading ZS2 of the counter register 41.

The control circuit 70 has a clock terminal C70 for applying an external control clock Cext, from which it generates the internal control clock Cint, and a control terminal S70 for applying external control signals SE1, ..., SE4.

Upon applying a first external control signal SE1, the integrated semiconductor memory 100 is operated in a first operating mode. In order to operate the integrated semiconductor memory in the first operating mode, the control circuit 70 generates the first control signal S1 and thereby drives the first controllable switch 61 of the receiver circuit 60. Via the first controllable switch 61, input data present at the data terminal DIO can be stored in the memory cell array 10 via the data line DL. In the first operating mode of the integrated semiconductor memory, a respective input datum DQ is, for example, stored in one memory cell of the memory cell array. In the first operating mode, output data DQ read out from the memory cell array 10 can be fed to the data terminal DIO.

If the control circuit 70 is driven with a second external control signal SE2, the control circuit operates the integrated semiconductor memory 100 in a second operating mode. In the second operating mode, the control circuit 70 controls the first controllable switch 61 of the receiver circuit 60 into the on state. In contrast to the first operating mode, however, in the second operating mode the memory cell array 10 is driven by the control circuit 70 via its control terminal S10 such that an input datum present at the data terminal DIO is stored, not just in one memory cell SZ, but rather in a plurality of memory cells of the memory cell array 10. Consequently, multiple storage of the input datum DQ is effected in the second operating mode.

If the control circuit 70 is driven with a third external control signal SE3, the control circuit 70 operates the integrated semiconductor memory 100 in a third operating mode. In the third operating mode, the control circuit 70 generates the second control signal S2, which switches the second controllable switch 62 of the receiver circuit 60 into the on state. The output data DQ from the memory cell array 10 are not transferred directly to the data terminal DIO, but rather are fed as input data Din to the evaluation circuit 20 via the second controllable switch 62 controlled in the on state. The evaluation circuit 20 can thus evaluate the input data multiply stored in the second operating mode in that that data value which occurs more frequently in the input data Din of the evaluation circuit than other data values is buffer-stored in the second storage register 22 of the evaluation circuit 20. As a result of applying the fourth control signal S4, the data value stored in the second storage register 22 is read out as output datum Dout at the first output terminal A20a. The output datum Dout can be fed for outputting via the controllable switch 63 to the data terminal DIO.

If the control circuit 70 is driven with a fourth external control signal SE4, the control circuit 70 operates the integrated semiconductor memory 100 in a fourth operating mode. In the fourth operating mode, the control circuit 70 generates the third control signal S3, which controls the third controllable switch 63 of the receiver circuit 60 in the on state. In the fourth operating mode, the input data present at the data terminal DIO are not fed directly to the memory cells of the memory cell array 10, but rather are fed as input data Din to the evaluation circuit 20. The data value which occurs more frequently in the input data Din than other data values is once again stored in the second storage register 22 of the evaluation circuit 20. As a result of the driving of the evaluation circuit 20 with the fourth control signal S4, the data value stored in the second storage register 22 can be read out as output datum Dout at the first output terminal A20a of the evaluation circuit. Via the second controllable switch 62, the output datum Dout can be fed to the data line DL and thus for storage to the memory cell array 10.

Figure 2:
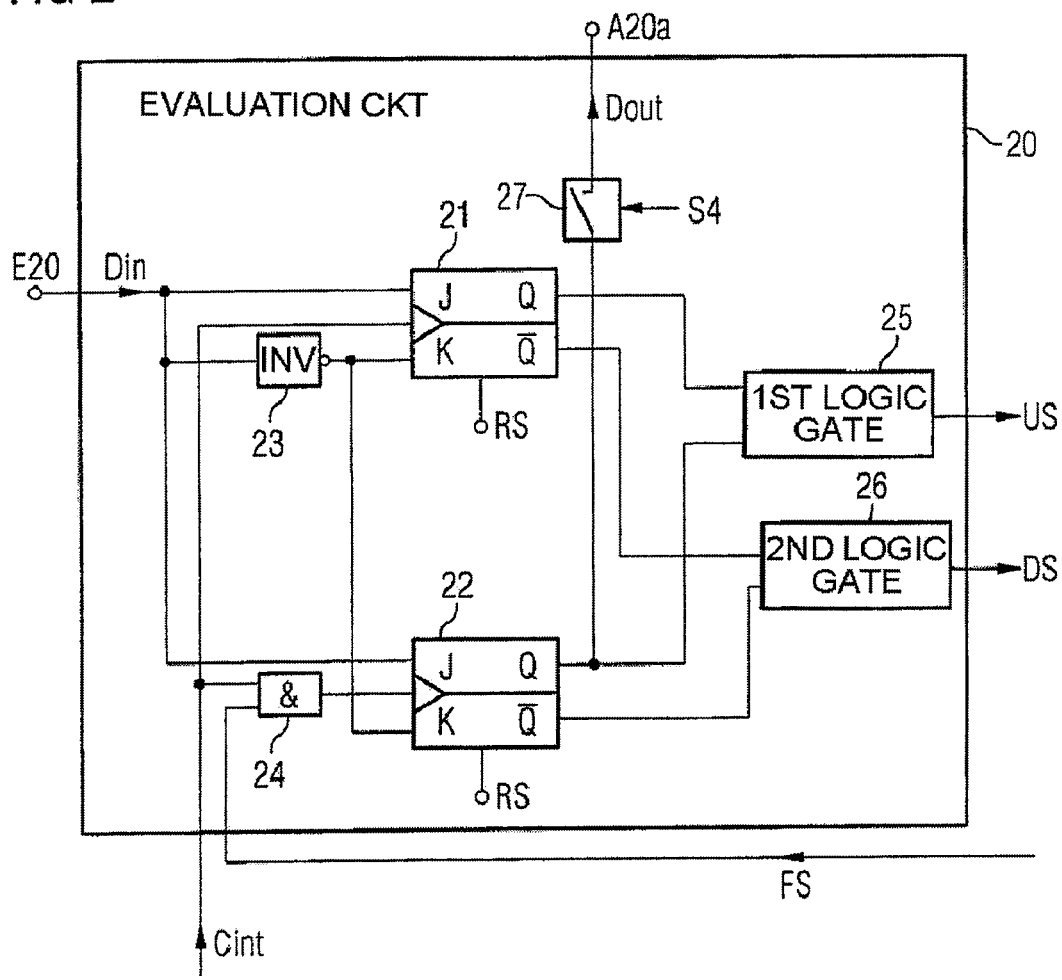
FIG. 2 shows an embodiment of an evaluation circuit for reducing transfer errors in accordance with the invention.

FIG. 2 shows an embodiment of the evaluation circuit 20. The evaluation circuit 20 includes the first storage register 21 and the second storage register 22, which are, for example, designed as a JK flip-flop having the output terminals Q and /Q. The JK flip-flops have a terminal for applying the reset signal RS. The input data Din are fed via the input terminal E20 to a J input and, in negated fashion via an inverter 23, to a K input of the flip-flops 21, 22. The Q outputs of the flip-flops 21 and 22 are fed to a first logic gate 25, for example, an EXNOR gate. The second outputs /Q of the flip-flops 21, 22 are connected to the inputs of a second logic gate 26, for example, an EXOR gate. The first logic gate 25 generates the first control signal US on the output side and the second logic gate 26 generates the second control signal DS on the output side. The first multivibrator 21 is furthermore driven by the internal control clock Cint. An AND gate 24 is connected upstream of the clock input terminal of the second flip-flop 22. The AND gate 24 is driven by the internal control clock Cint and by the enable signal FS of the counter circuit 30 on the input side.

The input datum present at the input terminal E20 is read into the first storage register 21 each time the flip-flop is driven with the internal control clock Cint, whereas the input datum is read into the second storage register 22, when driving by the internal control clock when the evaluation circuit 20 is additionally driven with the enable signal FS by the counter circuit 30. Consequently, a data value is read into the second storage register 22, when the counter register 31 of the counter circuit 30 has been decremented to the low threshold value, for example, the value 0. As a result, that data value which occurs more frequently in the input data Din than other data values is always stored in the second storage register 22.

If the data values stored in the first storage register 21 and in the second storage register 22 match, the EXNOR gate 25 generates the first control signal US on the output side, which control signal effects incrementing of the first counter reading ZS1 stored in the counter register 31. If, by contrast, the data values stored in the first and second storage registers 21 and 22 are different, the EXOR gate 26 generates the second control signal DS on the output side, so that the first counter reading ZS1 of the counter register 31 is decremented.

In order to read out the data value stored in the second storage register 22, the evaluation circuit 20 has a controllable switch 27, which connects the Q output of the second storage register 22 to the first output terminal A20a for generating the output datum Dout. The controllable switch 27 is closed in the case of driving by the fourth control signal S4, so that the second storage register 22 can be read.

Figure 3A:
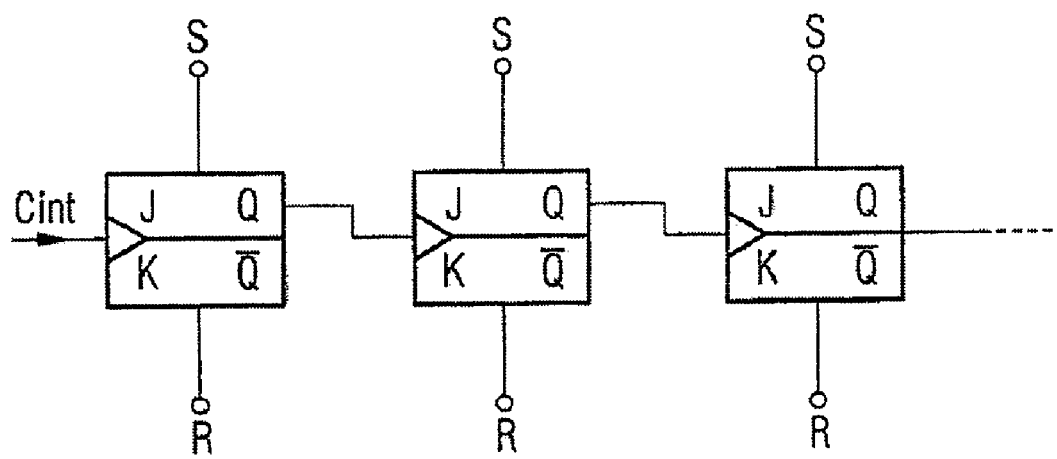
FIG. 3A shows a first embodiment of a counter register.

FIG. 3A shows one embodiment of a counter circuit designed as an incrementer. The counter circuit includes three JK flip-flops. The output terminal Q of each flip-flop is connected to the clock terminal of the next JK flip-flop. When the chain is driven with the input clock signal Cint, a binary value stored in the JK flip-flops can be counted up. The chain can be preallocated a binary value via a terminal S and can be reset to an initial value via a terminal R.

Figure 3B:
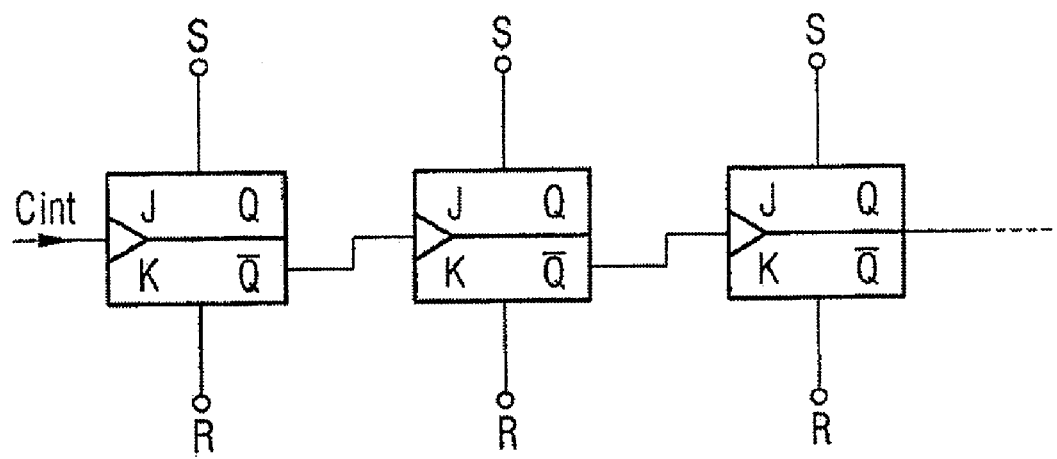
FIG. 3B shows a second embodiment of a counter register.

FIG. 3B shows a further embodiment of a counter circuit designed as a decrementer. The circuit includes a chain of JK flip-flops, the negated output terminal /Q of each flip-flop is connected to the clock terminal of the next JK flip-flop. A binary value can be prestored in the chain via a terminal S. The start value is decremented after driving of the first JK flip-flop with the control clock signal Cint. The binary value stored in the flip-flop chain can be reset or erased via a terminal R.

FIG. 3C shows an embodiment of the counter circuit 30 which can be used as an incrementer and as a decrementer and in which an overflow or an underflow is avoided. The circuit includes a chain of three JK flip-flops 31a, 31b, 31c, which can be driven via a terminal S for setting a start value and a terminal R for resetting the value stored in the chain. The Q output of the flip-flops 31a, 31b is connected via an AND gate 38a to the clock terminal of the next flip-flop. The /Q output of the flip-flops 31a, 31b is connected via an AND gate 38b to the clock input of the next flip-flop.

The AND gates 38a each have a terminal for applying the first control signal US. If the counter circuit 30 is driven with the first control signal US by the evaluation circuit 20, the three flip-flops 31a, 31b, 31c are connected up in the manner as shown in FIG. 3A. The flip-flop chain operates as an incrementer in this case. The AND gates 38b each have a terminal for applying the second control signal DS. If the counter circuit 30 is driven with the second control signal DS by the evaluation circuit 20, the JK flip-flops 31a, 31b, 31c are connected up as a decrementer, as shown in FIG. 3B. The binary values Q1, Q2, Q3, which are stored in the flip-flop circuits 31a, 31b, 31c and specify the counter reading can be read out via a multiplexer 33.

The Q outputs of the flip-flops 31a, 31b, 31c are each connected to a NAND gate 32. The negated outputs /Q of the flip-flops 31a, 31b, 31c are each connected to a NAND gate 34. The NAND gate 32 generates a control signal UES on the output side, which control signal is fed to an AND gate 36. The AND gate 36 is furthermore driven by the first control signal US of the evaluation circuit and the internal control clock Cint. The second NAND gate 34 generates a control signal DES on the output side, which control signal is fed to an AND gate 37. The AND gate 37 is furthermore driven by the second control signal DS of the evaluation circuit and the internal clock signal Cint. Negation of the control signal DES by an inverter 35 gives rise to the enable signal FS, which effects the storage of an input datum in the second counter register 22 of the evaluation circuit 20.

If the logic value 1 corresponding to a high threshold value is in each case stored in the flip-flops 31a, 31b, 31c, the NAND gate 32 generates the control signal UES with a low level on the output side. If the counter circuit 30 is driven by the first control signal US of the evaluation circuit 20 upon the next internal control clock Cint, the counter chain is prevented from being counted up further by the AND gate 36. If the logic value 0 corresponding to a low threshold value is stored in the flip-flops 31a, 31b, 31c, the negated outputs /Q drive the NAND gate 34 with the logic value 1. The NAND gate 34 thus generates the control signal DES with a low level on the output side. If the counter circuit 30 is driven by the second control signal DS upon the following internal control clock Cint, the AND gate 37 prevents a further decrementing of the counter chain. Therefore, the upper or lower threshold value always remains stored in the counter chain, so that an overflow or underflow is avoided.

If the counter chain is counted down to 0, i.e., the NAND gate 34 generates the low level on the output side, the enable signal FS with a high level arises at the inverter circuit 35 and effects the exchange of a data value of the second storage register 22 of the evaluation circuit 20.

Figure 4:
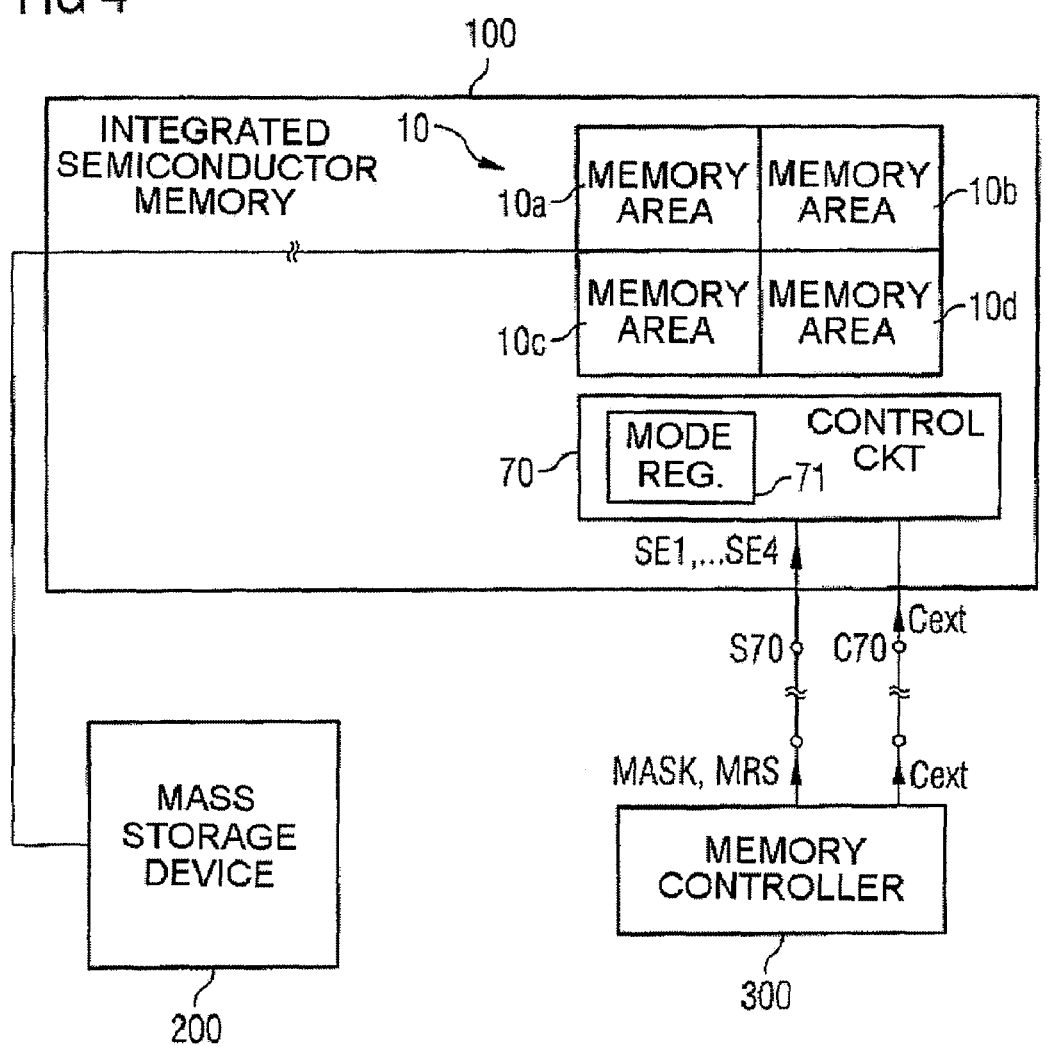
FIG. 4 shows a circuit arrangement having an integrated semiconductor memory in accordance with the invention.

FIG. 4 shows a circuit arrangement, for example, on a motherboard circuit board of a computer, with the integrated semiconductor memory 100 according to the invention having a memory cell array 10 subdivided into four memory areas 10a, 10b, 10c, 10d. The integrated semiconductor memory 100 furthermore includes the control circuit 70 with a storage component 71 as already described above. In this case, the storage component 71 stores items of information with regard to the operation of the integrated semiconductor memory 100 in the first, second, third, and fourth operating modes. The storage component 100 corresponds, for example, to a mode register that is customary in the case of DRAM memories. The mode register 71 can store, for example, items of information about the number of multiple storage of the input data DQ in the memory cells of the memory cell array 10 during operation of the integrated semiconductor memory in the second operating mode. Likewise, the mode register 71, for example, can store the information about the number of input data Din after the feeding of which to the evaluation circuit 30 the control circuit 70 generates the fourth control signal S4 for generating the output datum Dout. The mode register 71 can be initialized by a control command MRS, which is generally transmitted by a memory controller 300, so that the memory protocol is redefined.

As a result of the memory cell array 100 being subdivided into subareas 10a, . . . , 10d, an input datum DQ is stored in a respective one of the memory cells of the four memory areas, so that quadruple storage is made possible by the embodiment shown in FIG. 4. An item of information about the level of multiple storage, for example, 2-/4-/8-/16-fold, can be stored in the mode register 71, for example, during initialization of the mode register.

As a result of the control circuit 70 being driven with the control signals SE2, SE3, SE4, multiple storage of an input datum occurs or the evaluation circuit 20 for reducing transfer errors is activated when reading out a data value or writing a data value to the memory cell array.

Depending on the number of memory areas into which the memory cell array 10 has been subdivided or on what level of multiple storage has been chosen, the memory of the memory cell array 10 that is used for redundant storage can be paged out to a mass storage device 200, for example, a hard disk storage device. In the case of redundancy generation in binary multiples, i.e., 4-/8-/16-/32-fold, the memory space which is required for acquiring redundancy and can be paged out, e.g., on a hard disk storage device accordingly corresponds to ¾, ⅞, 15/16, 31/32 of the memory requirement.

In order to activate the evaluation circuit 20, it is possible, for example, to use the MASK command of the memory controller 300. The MASK command is already present and being used only little. The MASK command is usually used to suppress a data transfer or data storage. In the case where the integrated semiconductor memory according to the invention is used on a motherboard, the MASK command of the memory controller is reinterpreted by the control circuit when the integrated semiconductor memory is operated in the third and fourth operating modes. When the integrated semiconductor memory is operated in the third and fourth operating modes, for example, the evaluation circuit 20 for evaluating input data Din remains activated as long as the memory controller 300 drives the control circuit 70 with the MASK command. By contrast, an absence of the MASK command in the third and fourth operating modes effects an initialization or a resetting of the data values stored in the storage registers 21, 22 and the counter registers 31, 41.

Use of the evaluation circuit 20, the counter circuit 30, and the event counter 40 for the reduction of data transfer errors need not be restricted exclusively to a semiconductor memory chip, but rather may also be used by the memory controller, for example. As a result, data transfer errors, which arise when communicating an item of information to the memory controller, can likewise be reduced.

While the invention has been described in detail and with reference to specific embodiments thereof, it will be apparent to one skilled in the art that various changes and modifications can be made therein without departing from the spirit and scope thereof. For example, some or all of the subject matter may be embodied as software, hardware or a combination thereof. Accordingly, it is intended that the present invention covers the modifications and variations of this invention provided they come within the scope of the appended claims and their equivalents.

| List of reference symbols: | |
|---|---|
| 10 | Memory cell array |
| 20 | Evaluation circuit |
| 21, 22 | Storage units |
| 23 | Inverter |
| 24 | AND gate |
| 25 | EXNOR gate |
| 26 | EXOR gate |
| 27 | Controllable switch |
| 30 | Counter circuit |
| 31 | Counter register |
| 32 | AND gate |
| 33 | Multiplexer |
| 34 | AND gate |
| 35 | Inverter |
| 36 | AND gate |
| 37 | AND gate |
| 40 | Event counter |
| 41 | Counter register |
| 60 | Receiver circuit |
| 61, 62, 63 | Controllable switch |
| 70 | Control circuit |
| 200 | Hard disk storage device |
| 300 | Memory controller |
| AT | Selection transistor |
| BL | Bit line |
| BQ | Input/output datum |
| Cext | External control clock |
| Cint | Internal control clock |
| DES | Control signal |
| Din | Input data |
| DL | Data line |
| Dout | Output data |
| DS | Control signal |
| FS | Enable signal |
| MASK | Masking command |
| MRS | Mode register set command |
| Q | Data value |
| QN | Inverted data value |
| RS | Reset signal |
| S1, . . . , S6 | Control signal |
| SC | Storage capacitor |
| SZ | Memory cell |
| UES | Control signal |

| -continued | |
|---|---|
| List of reference symbols: | |
| US | Control signal |
| WL | Word line |

What is claimed is:

1. An integrated semiconductor memory, comprising:
a memory cell array having memory cells, the memory cell array storing an input data at multiple locations in the memory cells; and
an evaluation circuit having a first storage register, a second storage register, an input terminal for applying input data, and a first output terminal for generating an output datum, the input data stored at multiple locations in the memory cells of the memory cell array being input to the evaluation circuit,
wherein, if a first data value of an input datum occurs more frequently in the input data than a second data value of the input datum, the evaluation circuit storing the first data value of the input data in the second storage register, and
if the second data value occurs more frequently in the input data than the first data value, the evaluation circuit storing the second data value of the input data in the second storage register.

2. The integrated semiconductor memory as claimed in claim 1, further comprising:
a counter circuit has a counter register for storing a first counter reading, wherein,
if a first datum of the input data having the first or second data value is input to the evaluation circuit, the counter circuit increases the first counter reading of the counter register,
if a further datum of the input data having the same data value as the first datum of the input data is input to the evaluation circuit, the counter circuit increases the first counter reading of the counter register, and
if the further datum of the input data having a different data value than the first datum of the input data is input to the evaluation circuit, the counter circuit decreases the first counter reading of the counter register.

3. The integrated semiconductor memory as claimed in claim 2, wherein
the evaluation circuit has a second output terminal for generating a first control signal and a third output terminal for generating a second control signal,
if the further datum of the input data having the same data value as the first datum of the input data is input to the evaluation circuit, the evaluation circuit drives the counter circuit with the first control signal, and
if the further datum of the input data having a different data value than the first datum of the input data is input to the evaluation circuit, the evaluation circuit drives the counter circuit with the second control signal.

4. The integrated semiconductor memory as claimed in claim 3, wherein
if the data value of the first storage register matches the data value of the second storage register, the evaluation circuit generates the first control signal, and
if the data value of the first storage register differs from the data value of the second storage register, the evaluation circuit generates the second control signal.

5. The integrated semiconductor memory as claimed in claim 4, wherein the evaluation circuit includes a terminal for applying a reset signal, the evaluation circuit erases the data values stored in the first and second storage registers when the reset signal is applied.

6. The integrated semiconductor memory as claimed in claim 3, wherein
the counter circuit has a first input terminal and a second input terminal,
if the first input terminal is driven with the first control signal of the evaluation circuit, the counter circuit increases the first counter reading of the counter register, and if the second input terminal is driven with the second control signal of the evaluation circuit, the counter circuit decreases the first counter reading of the counter register.

7. The integrated semiconductor memory as claimed in claim 3, wherein the counter register includes a plurality of multivibrators, the multivibrators connected to one another such that the first counter reading of the counter register is increased when the counter register is driven with the first control signal and decreased when the counter register is driven with the second control signal.

8. The integrated semiconductor memory as claimed in claim 2, wherein
the counter register of the counter circuit is configured to store both a first threshold value and a second threshold value, and
if the first counter reading of the counter register has the first and the second threshold value, the counter circuit leaves the first counter reading of the counter register unchanged.

9. The integrated semiconductor memory as claimed in claim 8, wherein the counter register includes a plurality of multivibrators, the multivibrators connected to one another such that the first counter reading of the counter register is increased when the counter register is driven with the first control signal and decreased when the counter register is driven with the second control signal.

10. The integrated semiconductor memory as claimed in claim 1, further comprising:
an event counter having a counter register for storing a second counter reading, the event counter increasing the second counter reading of the event counter, if an input datum of the input data is input to the evaluation circuit.

11. The integrated semiconductor memory as claimed in claim 10, wherein the event counter has a terminal for applying the reset signal, the event counter erases the second counter reading stored in the counter register of the event counter when the reset signal is applied.

12. The integrated semiconductor memory as claimed in claim 1, further comprising:
a receiver circuit having a first control terminal for applying a first control signal;
a second control terminal for applying a second control signal; and
a third control terminal for applying a third control signal, wherein
when driving with the first control signal, the data terminal for inputting and outputting data is connected to the memory cell array,
when driving with the second control signal, the data of the memory cell array are input to the evaluation circuit, and
when driving with the third control signal, the input data at the data terminal are input to the evaluation circuit.

13. The integrated semiconductor memory as claimed in claim 1, wherein the evaluation circuit has a control terminal for applying a fourth control signal, and when driving with the fourth control signal, the evaluation circuit generates the output datum at the first output terminal.

14. The integrated semiconductor memory as claimed in claim 12, the integrated semiconductor memory being operated in a first operating mode, further comprising:
a control circuit having a control terminal for applying control signals, the control circuit operates the integrated semiconductor memory in the first operating mode when a first control signal is applied to the control terminal of the control circuit, and when the integrated semiconductor memory is operated in the first operating mode, for driving the receiver circuit, the control circuit generates the first control signal and drives the memory cell array such that a respective datum of the input data present at the data terminal is stored in one of the memory cells of the memory cell array.

15. The integrated semiconductor memory as claimed in claim 14, the integrated semiconductor memory being operated in a second operating mode for a multiple storage of input data present at the data terminal, wherein
the control circuit operates the integrated semiconductor memory in the second operating mode when a second control signal is applied to the control terminal of the control circuit, and when the integrated semiconductor memory is operated in the second operating mode, the control circuit drives the receiver circuit with the first control signal and drives the memory cell array such that a respective input datum of the input data is stored in at least two of the memory cells of the memory cell array.

16. The integrated semiconductor memory as claimed in claim 15, wherein, in the second operating mode of the integrated semiconductor memory, the control circuit subdivides the memory cell away into a first memory area and at least one second memory area, the at least one of the two memory cells is arranged in the first memory area, and the other of the at least two memory cells is arranged in the second memory area.

17. The integrated semiconductor memory as claimed in claim 14, the integrated semiconductor memory being operated in a third operating mode, wherein
the control circuit operates the integrated semiconductor memory in the third operating mode when a third control signal is applied to the control terminal of the control circuit, and when the integrated semiconductor memory is operated in the third operating mode, the control circuit drives the receiver circuit with the second control signal.

18. The integrated semiconductor memory as claimed in claim 14, the integrated semiconductor memory being operated in a fourth operating mode, wherein
the control circuit operates the integrated semiconductor memory in the fourth operating mode when a fourth control signal is applied to the control terminal of the control circuit, and when the integrated semiconductor memory is operated in the fourth operating mode, the control circuit drives the receiver circuit with the third control signal.

19. The integrated semiconductor memory as claimed in claim 14, wherein
the control circuit has a storage component, the storage component of the control circuit stores items of information for the operation of the integrated semiconductor memory in the second, third, and fourth operating modes.

20. The integrated semiconductor memory as claimed in claim 19, wherein the storage component of the control circuit stores the items of information about the number of multiple locations of the respective input datum of the input data in the memory cells of the memory cell array when the integrated semiconductor memory is operated in the second operating mode, and stores the items of information about the number of input data after having been input to the evaluation circuit, the control circuit generates the fourth control signal, when the integrated semiconductor memory is operated in the third and fourth operating modes.

21. A circuit arrangement having an integrated semiconductor memory as claimed in claim 14, further comprising:
   a hard disk storage device,
   wherein prior to the multiple storage of the respective input datum of the input data in the other of the two memory cells arranged in the second memory area of the memory cell array, the control circuit stores the data value that was stored in the other of the two memory cells in the hard disk storage device.

22. The integrated semiconductor memory as claimed in claim 2, wherein the counter circuit has a terminal for applying the reset signal, the counter circuit erases the first counter reading stored in the counter register when the reset signal is applied.

23. A method for testing an integrated semiconductor memory, comprising:
   applying input data having data values to a data terminal of the integrated semiconductor memory;
   feeding the input data applied to the data terminal as input data to an evaluation circuit;
   storing a data value of a first datum of the input data in a first storage register and a second storage register;
   buffer-storing a data value of each datum of the input data that succeeds the first datum in the first storage register;
   storing the first data value in the second storage register, if the first data value has been buffer-stored more frequently in the first storage register than the second data value, and storing the second data value in the second storage register, if the second data value has been buffer-stored more frequently in the first storage register than the first data value; and
   feeding the data value stored in the second storage register for storage in one of the memory cells of the memory cell array.

24. The method for testing an integrated semiconductor memory as claimed in claim 23, further comprising:
   increasing a first counter reading, if the data value buffer-stored in the first storage register matches the data value stored in the second storage register, or decreasing the first counter reading, if the data value buffer-stored in the first storage register is different from the data value stored in the second storage register, and
   increasing a second counter reading, if a respective datum of the input data is input to the evaluation circuit.

25. The method for testing an integrated semiconductor memory as claimed in claim 23, further comprising:
   inputting the first and second counter readings to the data terminal.

26. A method for testing a circuit arrangement having an integrated semiconductor memory, comprising:
   applying input data having data values to a data terminal of the integrated semiconductor memory;
   subdividing the memory cell array into a first memory area and a second memory area, a first of at least two memory cells being used for a multiple storage and being arranged in the first memory area of the memory cell array and a second of the at least two memory cells being used for a multiple storage and being arranged in the second memory area;
   storing a data value stored in the second memory cell of the at least two memory cells in the hard disk storage device; and
   storing a respective input datum of the input data in multiple locations in the first memory cell in the first memory area and the second memory cell in the second memory area of the memory cell array.

27. A method for testing an integrated semiconductor memory, comprising:
   providing an integrated semiconductor memory having an evaluation circuit, a first storage register and a second storage register for storing a first and second data value, an input terminal for applying input data, and an output terminal for generating an output datum;
   applying input data having data values to a data terminal of the integrated semiconductor memory;
   multiply storing a respective input datum of the input data by storing the respective input datum of the input data in at least two memory cells of a memory cell array;
   feeding the input data stored in the at least two memory cells for multiple storage as input data of the evaluation circuit to the input terminal of the evaluation circuit;
   storing a data value of a first datum of the input data in the first storage register and the second storage register;
   buffer-storing a data value of each datum of the input data that succeeds the first datum in the first storage register;
   storing the first data value in the second storage register, if the first data value has been buffer-stored more frequently in the first storage register than the second data value, and storage of the second data value in the second storage register, if the second data value has been buffer-stored more frequently in the first storage register than the first data value; and
   feeding the data value stored in the second storage register to the data terminal.

28. The method for testing an integrated semiconductor memory as claimed in claim 27, further comprising:
   increasing a first counter reading, if the data value buffer-stored in the first storage register matches the data value stored in the second storage register, or decreasing the first counter reading, if the data value buffer-stored in the first storage register is different from the data value stored in the second storage register; and
   increasing a second counter reading, if a respective datum of the input data is input to the evaluation circuit.

29. The method for testing an integrated semiconductor memory as claimed in claim 27, further comprising:
   inputting the first and second counter readings to the data terminal.

* * * * *